(12) United States Patent
Nouri et al.

(10) Patent No.: US 9,617,618 B2
(45) Date of Patent: Apr. 11, 2017

(54) SILICON PURIFICATION MOLD AND METHOD

(71) Applicant: Silicor Materials Inc., Palo Alto, CA (US)

(72) Inventors: Abdallah Nouri, Brampton (CA); Chunhui Zhang, Mississauga (CA); Kamel Ounadjela, Belmont, CA (US)

(73) Assignee: Silicor Materials Inc., San Jose, CA (US)

( * ) Notice: Subject to any disclaimer, the term of this patent is extended or adjusted under 35 U.S.C. 154(b) by 73 days.

(21) Appl. No.: 14/375,743

(22) PCT Filed: Feb. 1, 2013

(86) PCT No.: PCT/US2013/024333
§ 371 (c)(1),
(2) Date: Jul. 30, 2014

(87) PCT Pub. No.: WO2013/116640
PCT Pub. Date: Aug. 8, 2013

(65) Prior Publication Data
US 2015/0128764 A1    May 14, 2015

Related U.S. Application Data

(60) Provisional application No. 61/593,573, filed on Feb. 1, 2012.

(51) Int. Cl.
*C22B 9/00* (2006.01)
*C22B 21/06* (2006.01)
(Continued)

(52) U.S. Cl.
CPC ............ *C22B 9/00* (2013.01); *C01B 33/02* (2013.01); *C01B 33/037* (2013.01); *C22B 21/06* (2013.01);
(Continued)

(58) Field of Classification Search
CPC .......... C22B 9/00; C22B 21/06; C01B 33/037; C30B 11/002; C30B 11/003; C30B 29/06
See application file for complete search history.

(56) References Cited

U.S. PATENT DOCUMENTS 3,069,240 A    12/1962  Armand
4,312,847 A *   1/1982  Dawless ............... C01B 33/037
                                              23/295 R
(Continued)

FOREIGN PATENT DOCUMENTS

CN    101479410 A    7/2009
CN    101680111 A    3/2010
(Continued)

OTHER PUBLICATIONS

Derwent Acc No. 2011-E44285 for the patent family including WO 2011048473 A1 published Apr. 2011 by Bernabini et al.*
(Continued)

*Primary Examiner* — George Wyszomierski
*Assistant Examiner* — Tima M McGuthry Banks
(74) *Attorney, Agent, or Firm* — Schwegman Lundberg & Woessner, P.A.

(57) ABSTRACT

The present invention relates to an apparatus and method for purifying materials using a fractional solidification. Devices and methods shown provide control over a temperature gradient and cooling rate during fractional solidification, which results in a material of higher purity. The apparatus and methods of the present invention can be used to make silicon material for use in solar applications such as solar cells.

11 Claims, 4 Drawing Sheets

(51) Int. Cl.
*C01B 33/03* (2006.01)
*C30B 11/00* (2006.01)
*C30B 29/06* (2006.01)
*C01B 33/037* (2006.01)
*C01B 33/02* (2006.01)
*F27B 14/14* (2006.01)
*F27B 14/20* (2006.01)

(52) U.S. Cl.
CPC .......... *C30B 11/002* (2013.01); *C30B 11/003* (2013.01); *C30B 29/06* (2013.01); *F27B 14/14* (2013.01); *F27B 14/20* (2013.01)

(56) References Cited

U.S. PATENT DOCUMENTS

| | | | |
|---|---|---|---|
| 7,959,730 | B2 | 6/2011 | Nichol |
| 9,054,249 | B2 † | 6/2015 | Chaudhari |
| 2009/0092535 | A1 | 4/2009 | Nichol |
| 2009/0208400 | A1 | 8/2009 | Julsrud et al. |
| 2009/0274607 | A1 | 11/2009 | Nichol |
| 2010/0143231 | A1 | 6/2010 | Nishio et al. |
| 2010/0163550 | A1* | 7/2010 | Belsh .................... F27B 14/061 219/634 |
| 2011/0044877 | A1 | 2/2011 | Turenne et al. |
| 2011/0129405 | A1* | 6/2011 | Nichol .................. C01B 33/037 423/348 |
| 2011/0302963 | A1 | 12/2011 | Tathgar |
| 2012/0297580 | A1* | 11/2012 | Dughiero et al. ... B22D 27/045 23/295 |

FOREIGN PATENT DOCUMENTS

| | | |
|---|---|---|
| CN | 101855391 A | 10/2010 |
| EP | 2138610 A1 | 12/2009 |
| EP | 2749533 A1 | 7/2014 |
| EP | 2467330 B1 | 4/2016 |
| GB | 2479165 A | 10/2011 |
| JP | 56022620 A | 3/1981 |
| JP | 2009532316 A | 9/2009 |
| JP | 2010540392 A | 12/2010 |
| JP | 2013502359 A | 1/2013 |
| TW | 201345837 A | 11/2013 |
| WO | WO-2007112592 A1 | 10/2007 |
| WO | WO-2011020197 A1 | 2/2011 |

OTHER PUBLICATIONS

"Chinese Application Serial No. 201380007123.1, Office Action mailed Aug. 7, 2015", (w/ English Translation), 11 pgs.
"International Application Serial No. PCT/US2013/024333, International Preliminary Report on Patentability mailed Aug. 14, 2014", 11 pgs.
"International Application Serial No. PCT/US2013/024333, Response filed Jun. 13, 2013 to International Search Report mailed Apr. 16, 2013", 5 pgs.
"International Application Serial No. PCT/US2013/024333, Response filed Jul. 10, 2013", 2 pgs.
International Application Serial No. PCT/US2013/024333, International Search Report mailed Apr. 16, 2013, 4 pgs.
International Application Serial No. PCT/US2013/024333, Written Opinion mailed Apr. 16, 2013, 11 pgs.
"Chinese Application Serial No. 201380007123.1, Office Action mailed May 18, 2016", W/ English Translation, 16 pgs.
"Chinese Application Serial No. 201380007123.1, Response filed Feb. 22, 2016 to Office Action mailed Aug. 7, 2015", (English Translation of Claims), 12 pgs.
"European Application Serial No. 13704533.2, Examination Notification Art, 94(3) mailed Jan. 21, 2016", 5 pgs.
"European Application Serial No. 13704533.2, Office Action mailed Oct. 2, 2014", 2 pgs.
U.S. Appl. No. 14/375,743, filed Nov. 8, 2016 to Final Office Action mailed Sep. 8, 2016, 8 pgs.
Chinese Application Serial No. 201380007123.1, Office Action mailed Jan. 17, 2017, W/ English Translation, 15 pgs.
Chinese Application Serial No. 201380007123,1, Response filed Sep. 30, 2016 to Office Action mailed May 18, 2016, W/ English Translation of Claims, 12 pgs.
Japanese Application Serial No. 2014-555747, Notice of Reasons for Rejection mailed Feb. 20, 2017, (English Translation), 7 pgs.
Taiwanese Application Serial No. 102103094, Office Action mailed Jul. 19, 2016, 9 pgs.
Taiwanese Application Serial No, 102103094, Response filed Jan. 19, 2017 to Office Action mailed Jul. 19, 2017, With English Translation of Claims, 49 pgs.

\* cited by examiner
† cited by third party

SILICON PURIFICATION MOLD AND METHOD

PRIORITY APPLICATIONS

This application is a U.S. National Stage Filing under 35 U.S.C. 371 from International Application No. PCT/US2013/024333, filed on 1 Feb. 2013, and published as WO 2013/116640 A1 on 8 Aug. 2013, which claims the benefit of priority under 35 U.S.C. 119 to U.S. Provisional Patent Application No. 61/593,573, filed on Feb. 1, 2012, which are hereby incorporated by reference herein in their entirety.

BACKGROUND

Solar cells can be a viable energy source by utilizing their ability to convert sunlight to electrical energy. Silicon is a semiconductor material and the raw incoming material used in the manufacture of solar cells. The electrical properties of the cells, namely the conversion efficiency depends on the purity of the silicon. Several techniques have been used to purify silicon. The most well known technique is called 'Siemens process.' This technique removes substantially all impurities present within the silicon. However, this technique requires production of the silicon in a gas phase and re-depositing into a solid phase in order to remove the impurities. Other techniques include zone refinement, and directional solidification.

Many techniques used for purifying a large quantity of silicon operate on the principle that while silicon crystals are solidifying from a molten silicon solution, undesirable impurities remain in the molten solution. For example, a float zone technique, can be used to make silicon monocrystalline ingots using a moving liquid to urge impurities toward an edge of a mold for removal. Another example technique, the Czochralski technique, can be used to make silicon monocrystalline ingots using a seed crystal that is slowly pulled out of a molten solution, allowing the formation of a monocrystalline column of silicon while leaving impurities in the solution. Further example techniques, such as the Bridgeman or heat exchanger techniques, can be used to make silicon multicrystalline ingots through the creation of a temperature gradient with a controlled cooling rate, causing directional solidification Improvements in purification efficiency and cost are always desired.

OVERVIEW

Various techniques for making silicon crystals for solar cells utilize a crucible, or mold to hold molten silicon during purification operations. One challenge with purification operations is precisely controlling temperature within the crucible during the purification. In one example, if the temperature of a molten silicon alloy drops below a eutectic temperature, an unwanted eutectic phase may form Impurities can become trapped in the eutectic phase, and additional purification may be necessary to reach a desired purity of silicon.

The present molds, mold systems, and related methods provide means for purifying silicon using fractional solidification. The molds, mold systems, and related methods allow for control over a temperature gradient during crystallization, which can result in silicon of higher purity for use in solar cells.

A method of silicon purification may include cooling a molten silicon alloy, and precipitating silicon crystals from the molten alloy, leaving impurities in the remaining melt. A method of silicon purification may then include separating the precipitated silicon from the molten metal alloy.

To better illustrate the molds, mold systems, and related methods disclosed herein, a non-limiting list of examples is now provided:

In Example 1, a method includes forming a molten metal alloy in a crucible, wherein the alloy forms a binary eutectic system with silicon. The method also includes cooling at least a portion of the molten metal alloy to a temperature below a liquidus temperature and above a eutectic temperature to precipitate silicon from the molten metal alloy, controlling temperature within the crucible to maintain a minimum temperature above the eutectic temperature within the crucible, and separating the precipitated silicon from the molten metal alloy.

In Example 2, the method of Example 2 is optionally configured such that controlling temperature within the crucible further includes controlling a thermal gradient within the crucible such that precipitated silicon is concentrated in a bottom of the crucible, and a remaining molten metal alloy is concentrated in an upper portion of the crucible.

In Example 3, the method of any one or any combination of Examples 1-2 is optionally configured such that forming a molten metal alloy in a crucible includes forming a silicon-aluminum alloy in a crucible.

In Example 4, the method of any one or any combination of Examples 1-3 is optionally configured such that forming a molten metal alloy in a crucible includes forming silicon-aluminum alloy in a starting composition between approximately 60 wt. % silicon and 22 wt. % silicon, with a balance being substantially aluminum.

In Example 5, the method of any one or any combination of Examples 1-4 is optionally configured such that forming a molten metal alloy in a crucible includes forming silicon-aluminum alloy in a starting composition between approximately 50 wt. % silicon and 30 wt. % silicon, with a balance being substantially aluminum.

In Example 6, the method of any one or any combination of Examples 1-5 is optionally configured such that cooling includes maintaining a temperature within the crucible in a range between approximately 577° C.-1100° C.

In Example 7, the method of any one or any combination of Examples 1-6 is optionally configured such that cooling includes maintaining a temperature within the crucible in a range between approximately 720° C.-1100° C.

In Example 8, the method of any one or any combination of Examples 1-7 is optionally configured such that cooling includes maintaining a temperature within the crucible in a range between approximately 650° C.-960° C. In Example 9, the method of any one or any combination of Examples 1-8 is optionally configured such that controlling temperature within the crucible includes covering a top of the crucible.

In Example 10, a method includes forming a molten metal alloy in a crucible, wherein the alloy forms a binary eutectic system with silicon, cooling the molten metal alloy to a temperature below a liquidus temperature and above a eutectic temperature to precipitate silicon from the molten metal alloy, actively heating the crucible to maintain a minimum temperature above the eutectic temperature within the crucible, and separating the precipitated silicon from the molten metal alloy.

In Example 11, the method of Example 10 is optionally configured such that forming a molten metal alloy in a crucible includes forming a silicon-aluminum alloy in a crucible.

In Example 12, the method of any one or any combination of Examples 10-11 is optionally configured such that actively heating the crucible includes heating a top surface of the crucible.

In Example 13, the method of any one or any combination of Examples 10-12 is optionally configured such that actively heating the crucible includes heating sides of the crucible.

In Example 14, the method of any one or any combination of Examples 10-13 is optionally configured such that actively heating the crucible includes heating a top surface of the crucible.

In Example 15, a silicon purification system includes a crucible, including a plurality of crucible lining layers, a heating system located adjacent to the crucible to control temperature within at least a portion of the crucible, and a heating system controller configured to maintain a minimum temperature within the crucible above a binary silicon alloy eutectic temperature, when in operation.

In Example 16, the system of Example 15 is optionally configured such that the heating system includes a top heater.

In Example 17, the system of any one or any combination of Examples 15-16 is optionally configured such that the top heater includes a refractory layer within a metal shell.

In Example 18, the system of any one or any combination of Examples 15-17 is optionally configured such that the heating system includes side heaters.

In Example 19, the system of any one or any combination of Examples 15-18 is optionally configured such that the heating system includes a top heater.

In Example 20, the system of any one or any combination of Examples 15-19 is optionally configured such that the plurality of crucible lining layers includes a metal shell with refractory lining, with SiC bottom layer.

In Example 21, the system of any one or any combination of Examples 15-20 is optionally configured such that the heating system includes a top cover.

In Example 22, the system of any one or any combination of Examples 15-21 is optionally configured such that the heating system controller is configured to operate within a range between approximately 720° C.-1100° C.

In Example 23, the system of any one or any combination of Examples 15-22 is optionally configured to further include a scoop system to remove precipitated silicon from within a molten binary silicon alloy.

These and other examples and features of the present molds, mold systems, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various embodiments discussed in the present document.

DETAILED DESCRIPTION

Figure 1:
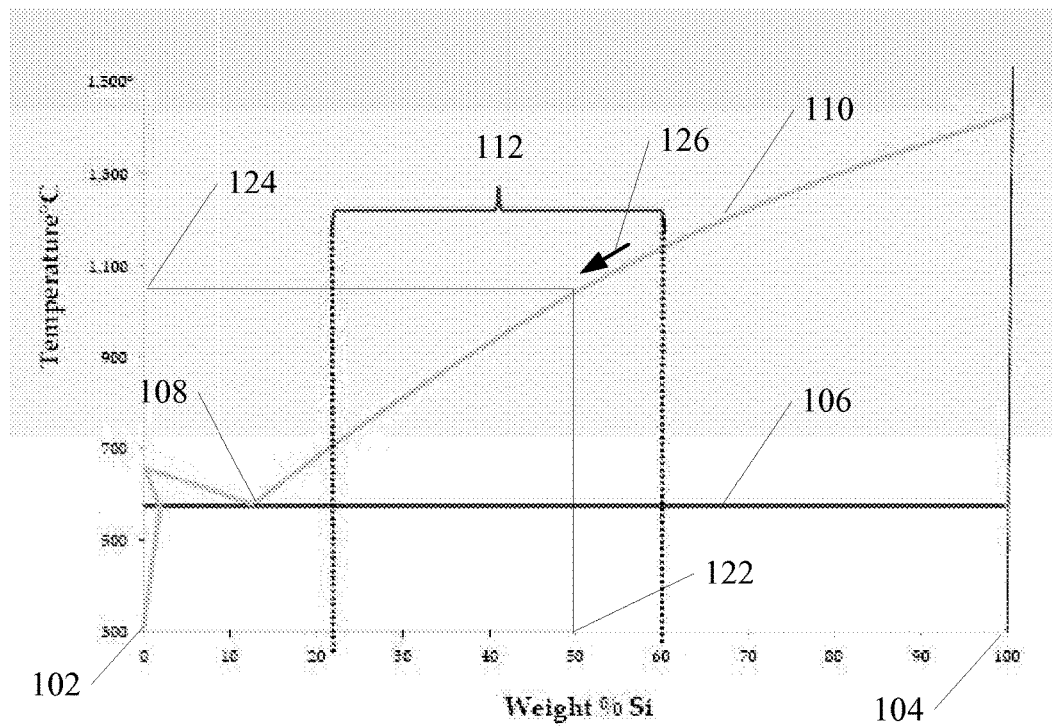
FIG. 1 shows a binary phase diagram according to at least one embodiment of the invention.

In the following detailed description, reference is made to the accompanying drawings. The drawings form a part of the description and are provided by way of illustration, but not of limitation. The drawing embodiments are described in sufficient detail to enable those skilled in the art to practice the present subject matter. Other embodiments may be utilized and mechanical, structural, or material changes may be made without departing from the scope of the present patent document.

Reference will now be made in detail to certain examples of the disclosed subject matter, some of which are illustrated in the accompanying drawings. While the disclosed subject matter will largely be described in conjunction with the accompanying drawings, it should be understood that such descriptions are not intended to limit the disclosed subject matter to those drawings. On the contrary, the disclosed subject matter is intended to cover all alternatives, modifications, and equivalents, which can be included within the scope of the presently disclosed subject matter, as defined by the claims.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation.

The present subject matter relates to molds, mold systems, and related methods for purifying silicon using fractional solidification techniques. The purified silicon resulting from the fractional solidification can be used in solar cells. It has been found that by controlling the temperature and temperature gradient within the mold, a highly controlled fractional solidification can be accomplished. Although purification of silicon is described in the most detail in examples below, systems and methods described can also be used for fractional solidification and purification of other materials such as sapphire.

In one example, a molten silicon alloy is formed using a silicon starting material that includes impurities. Silicon is precipitated (e.g. fractionally solidified) from the molten silicon alloy in a purification process. In one example, the molten silicon alloy is a binary alloy, although the invention is not so limited. In one example, impurities from the silicon starting material remain in an amount of remaining molten alloy, while the precipitated silicon is substantially pure. In one example, the molten silicon alloy is a binary silicon-aluminum alloy, as described below.

FIG. 1 illustrates a binary phase diagram of silicon and aluminum. The X-axis indicates the amount of silicon in an alloy, indicated in units of weight percent (wt. %). At point 102 on the phase diagram, a 100% aluminum material is indicated, with zero wt. % silicon. At point 104, a 100% silicon material is indicated, with zero wt % aluminum. A solidus line 106 is shown at the eutectic temperature of 577° C. for aluminum-silicon, with a eutectic point 108 indicated at the eutectic temperature and a composition of approximately 12.6 wt. % silicon. A liquidus line 110 is shown progressing downward from a temperature of approximately 1414° C. for pure silicon to 577° C. at the eutectic point.

A composition range 112 is also shown in FIG. 1, from approximately 60 wt. % silicon to approximately 22 wt. % silicon. In one example, the composition range 112 is from approximately 42 wt. % silicon to approximately 22 wt. % silicon. In one example, an initial composition begins at a silicon wt. % higher than 22 wt. % and progresses from a temperature above the liquidus line 110 for the selected composition. As cooling progresses in the crucible, and the temperature crosses the liquidus line 110, crystalline silicon flakes begin to form in the melt, and the composition of the remaining liquid progresses down the liquidus line as illustrated by arrow 126. For example, an initial concentration of alloy, with a silicon concentration of 60 wt. %, when cooled, will progress along the liquidus line 110 as indicated by arrow 126. At temperature 124, an amount of silicon flakes will have fractionally precipitated out of the molten alloy to bring the remaining liquid concentration to 50 wt. % silicon as indicated by point 122.

Impurities that may have been present in silicon starting material may substantially or completely remain in the liquid fraction, while the precipitated silicon flakes are substantially pure silicon. The silicon flakes may be collected and separated from the remaining melt. In this way, impurities in a silicon starting material may be removed to yield substantially pure silicon. The collected silicon flakes may be further processed to remove any remaining impurities, or they may be melted and re-formed to make electronic devices, such as photovoltaic devices.

In one example, further processing to remove any remaining impurities may include iteratively performing the fractional solidification technique described above. In one example, further processing to remove any remaining impurities may include washing the silicon flakes to remove any molten alloy residue. One example of washing may include an acid wash operation. In one example, other processing techniques may be used in addition to the fractional solidification technique described above, for example directional solidification may be used either before or after the fractional solidification technique described. In one example, after multiple processing operations, the silicon is melted and re-formed to make electronic devices, such as photovoltaic devices.

Figure 2:
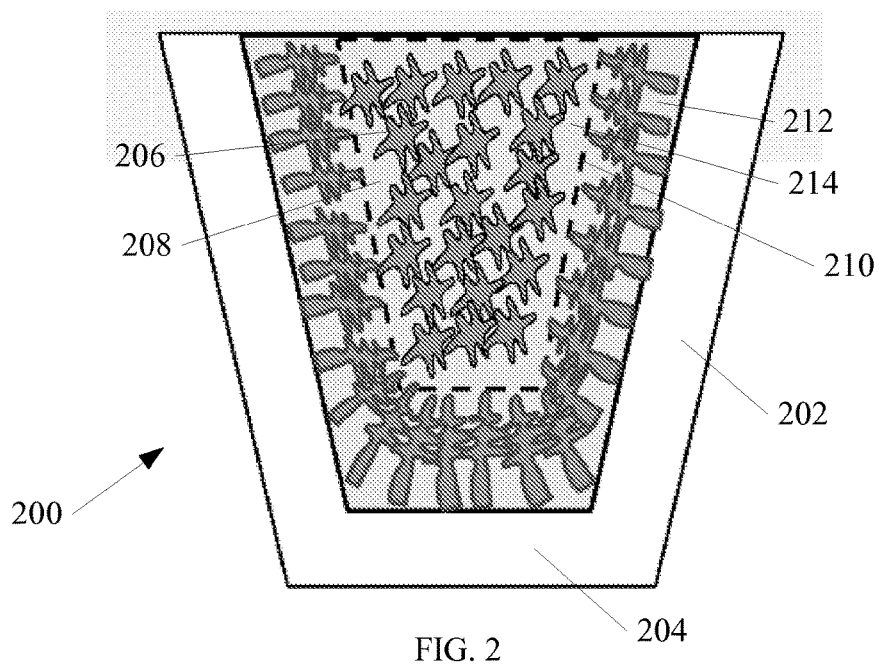
FIG. 2 shows a cross section of a mold according to at least one embodiment of the invention.

FIG. 2 illustrates a crucible 200 having sides 202 and a bottom 204. A number of silicon flakes 206 are illustrated, with a remaining liquid portion 208. A dashed line 210 is shown to indicate a zone 212 of silicon flakes formed adjacent to sides 202 of the crucible 200, and a zone 214 of silicon flakes in a middle portion of the crucible 200.

If the liquid portion is allowed to cool below the eutectic temperature, a solid phase exhibiting a lamellar microstructure is formed. A lamellar microstructure is not desirable, because it contains multiple layers of silicon and aluminum sandwiched together in a configuration where it is difficult to separate the silicon from the aluminum. It is desirable to increase a fraction of silicon flakes precipitating out of the melt, while not cooling the melt below the eutectic temperature.

In one example, at the cooling stage illustrated in FIG. 2, the silicon flakes 206 are separated from the liquid portion 208. In one example, separating includes collecting the silicon flakes 206 and removing them from the liquid portion 208. In one example, the liquid portion 208 is poured off, and the silicon flakes 206 remain in the crucible for collection.

Figure 3:
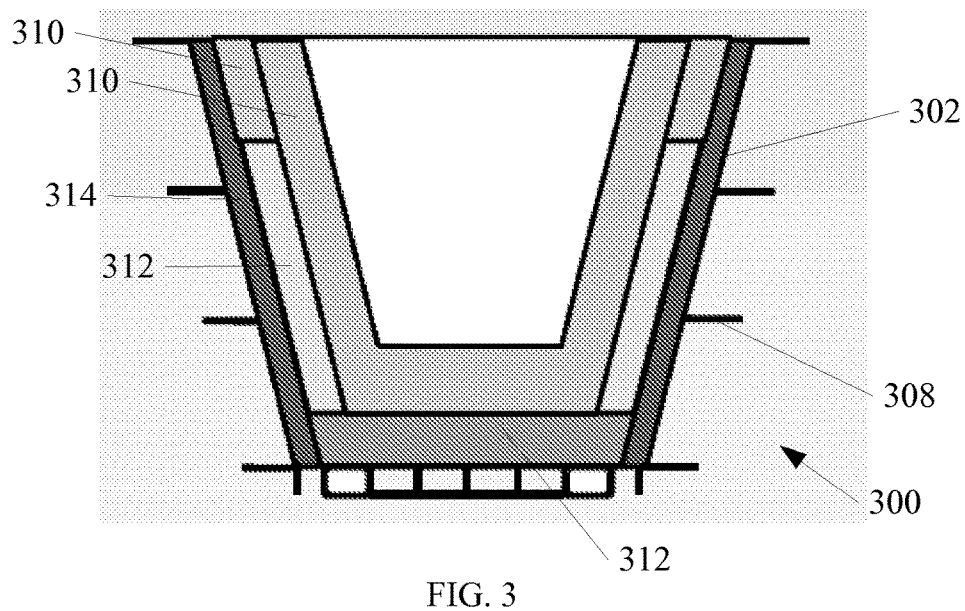
FIG. 3 shows a cross section of a mold according to at least one embodiment of the invention.

FIG. 3 shows a crucible 300 according to an embodiment of the invention. A number of different material layers are shown housed within a metal shell 306. In one example, a number of fins 308 are coupled to the metal shell 306. In one example, the fins 308 provide increased surface area for heat transfer. In one example, the fins 308 provide structural support and handling surfaces for the metal shell 306.

In one example material 310 includes a heat conduction property of approximately 2.5 Watts(W) per (meter (m)× degree Kelvin (K))=2.5 W/(mK). In one example, material 312 includes a heat conduction property of approximately 0.20 W/(mK). In one example, material 314 includes a heat conduction property of approximately 0.05 W/(mK). In one example at least bottom portion 312 includes a material that includes a heat conduction property of approximately 8 W/(mK). In one example, the bottom portion 312 includes silicon carbide (SiC).

As will be described in more detail below, in one example, the melt within the crucible 300 is cooled preferentially from the bottom. Configurations including SiC in a bottom portion 312 are adapted to cool preferentially from the bottom.

Figure 4:
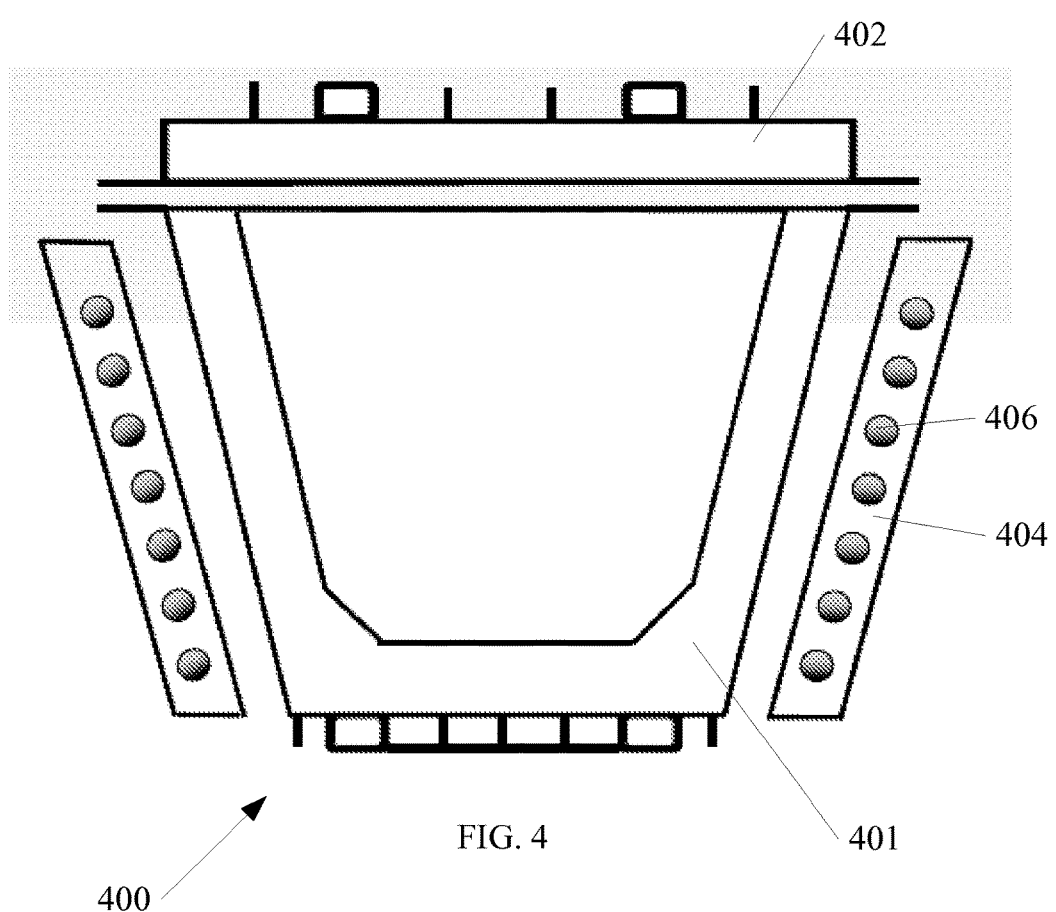
FIG. 4 shows a cross section of a system according to at least one embodiment of the invention.

FIG. 4 illustrates a system 400 according to an embodiment of the invention. A crucible 401 is shown. In one example, the crucible 401 is similar to crucible 300 as illustrated in FIG. 3. The system 400 includes a cover 402. In one example, the cover is adapted to retain heat within the crucible 401 during cooling. In one example the cover 402 includes insulating layers within a metal shell. In one example the cover provides passive insulation during a cooling operation.

In one example, the cover 402 includes one or more heating elements, such as resistive heating elements. In selected examples, a temperature of a top of the crucible 401 is controlled using either passive insulation or active heating elements, while a bottom of the crucible 401 is preferentially cooled, for example using a material with a higher thermal conductivity than walls or a cover 402 of the system.

In one example, walls of the crucible 401 are heated using one or more side heaters 404. Side heaters 404 shown in FIG. 4 include a number of resistive heating elements 406 that are used to control a temperature in walls of the crucible 401. In one example, the side heaters 404 also include additional insulation such as refractory material to maintain temperature in walls of the crucible 401.

The system 400 provides a number of temperature controls over the crucible 401. One control includes an ability to control temperatures of selected surfaces to prevent or reduce unwanted eutectic phase growth. Another control includes an ability to control a temperature gradient within the crucible. A more consistent temperature gradient may provide higher silicon flake precipitation efficiency, and higher yield. If the molten alloy in the crucible is maintained at a consistent temperature with a tight thermal gradient close to the eutectic temperature, then more silicon will precipitate, and less unwanted eutectic phase will form.

In one example, surfaces such as the top surface, and wall surfaces are controlled separately to provide optimum surface temperature control. In one example, the bottom of the crucible 401 is allowed to cool more quickly, as a result of factors such as a higher thermal conductivity material in the bottom of the crucible 401, and an absence of any active heating elements adjacent to the bottom of the crucible 401. Selected advantages of cooling a bottom of the crucible 401 more quickly are discussed in more detail below.

FIGS. 5A-5D illustrate modeled cooling of molten alloy 502 within a crucible 500 without elements such as side heaters, a top cover, or a top heater. The crucible 500 modeled in FIGS. 5A-5D does not include a bottom material with a higher thermal conductivity than walls of the crucible.

Figure 5A:
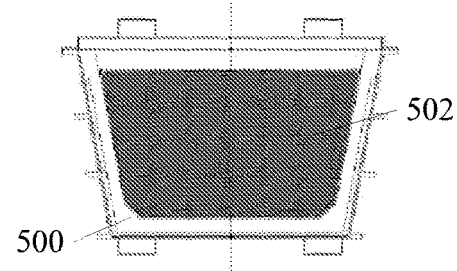
FIGS. 5A-5D show a series of modeled cooling profiles for silicon using a mold according to at least one embodiment of the invention.
Figure 5B:
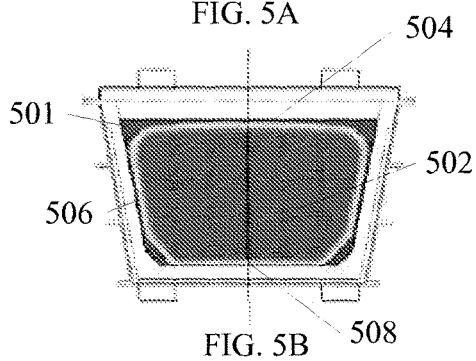

In FIG. 5A, substantially all of the alloy material within the crucible 500 is a molten silicon alloy 502. In FIG. 5B, after cooling, an amount of solid material 501 has formed at a top surface 504 and on sides 506 of the crucible 500, with an amount of molten alloy 502 remaining within a center of the crucible 500. A bottom 508 of the crucible remains substantially molten.

Figure 5C:
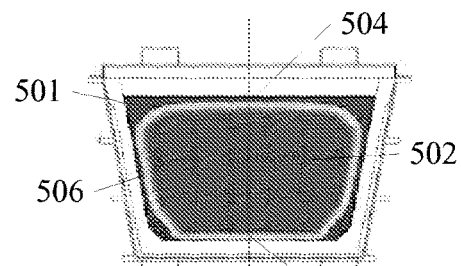
Figure 5D:
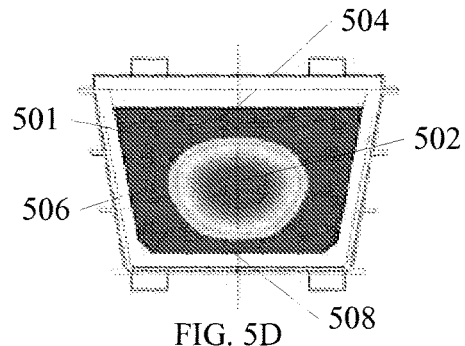

As cooling progresses, FIG. 5C illustrates progression of solid material 501 at the top 504 and sides 506 of the crucible. The bottom 508 remains substantially molten, along with the center of the crucible 500. In FIG. 5D, the fraction of solid material within the crucible has substantially increased, with the top 504, sides 506, and bottom 508 all forming solid material 501, and the remaining molten portion 502 being located in a middle of the crucible.

In this configuration, the remaining molten portion 502 is trapped within the crucible Impurities that remain in the remaining molten portion 502 may be difficult to separate from the rest of the solid portion within the crucible.

FIGS. 6A-6E illustrate modeled cooling of molten alloy 602 within a crucible 600 according to one or more embodiments of the invention, including features such as side heaters, top covers, top heaters, and a bottom that is more thermally conductive than sides of the crucible 600.

Figure 6A:
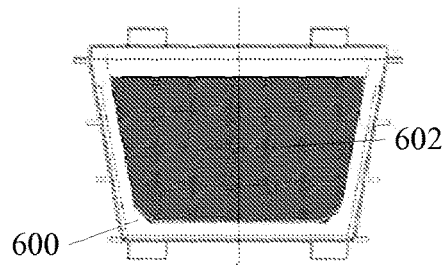
FIGS. 6A-6E show another series of modeled cooling profiles for silicon using a mold according to at least one embodiment of the invention.
Figure 6B:
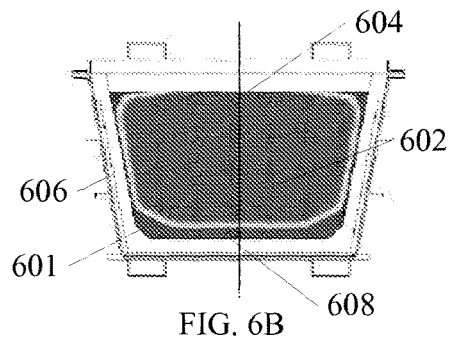

In FIG. 6A, substantially all of the alloy material within the crucible 600 is a molten silicon alloy 602. In FIG. 6B, after cooling, an amount of solid material 601 has formed at the bottom 608 with a small amount of solid material 601 forming along sides 606 of the crucible 600. A more conductive layer, such as silicon carbide, in the bottom 608 of the crucible encourages preferential cooling on the bottom 608. The top 604 and center of the crucible 600 remains substantially molten.

Figure 6C:
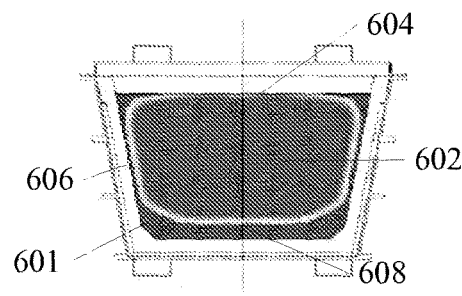
Figure 6D:
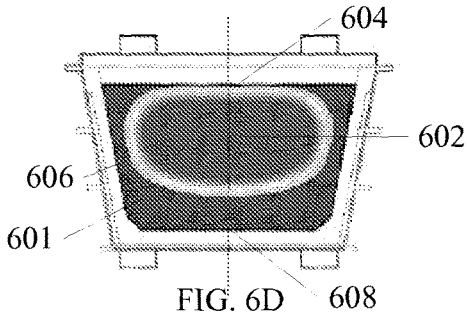

As cooling progresses, FIG. 6C illustrates progression of solid material 601 at the bottom 608, with minimal progression at the sides 606 and substantially no progression at the top 604 of the crucible 600. In FIG. 6D, the fraction of solid material 601 within the crucible has substantially increased, primarily from the bottom 608, upwards towards the top 604 and to some extent, from the sides 606. The top 604 remains substantially molten material 602.

Figure 6E:
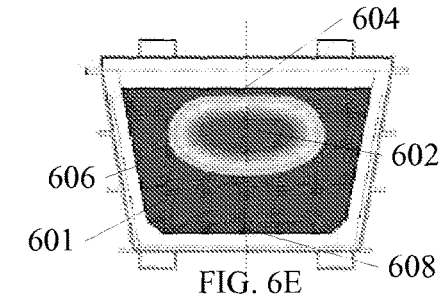

In FIG. 6E, a larger fraction of the molten material 602 has been solidified into solid material 601, leaving a remaining molten portion 602 that is near to the top 604 of the crucible 600. In one example, the solid material 601 consists primarily of silicon that has precipitated out of the molten material 602, at a temperature above the eutectic temperature of the silicon alloy. Utilizing features such as passive heat insulation, and/or active heaters on surfaces such as a top 604 and sides 606 of the crucible, temperature within the crucible is tightly controlled. Tight control of surface temperature above eutectic temperature ensures that little or no eutectic phase precipitates at the sides 606, bottom 608, or top 604 of the crucible. Additionally tight control of temperature gradient provides improved yield of precipitated silicon from the molten material 602, without inducing unwanted eutectic phase material.

Additionally, with the molten material 602 near the top 604 of the crucible, it may be easier to separate the molten material 602 and any dissolved impurities within the molten material 602. In one example, the molten material 602 may be poured out of the crucible 600. In one example, the solid material 601 may be scooped out of the crucible 600 using a scoop system, such as a sieve, or slotted scoop, or blade, etc. In one example, a combination of pouring off molten material 602 and scooping out purified solid material 601 may be used. As discussed in examples above, impurities will stay in solution in the molten material 602, while the precipitated silicon solid material 601 is substantially pure.

Figure 7:
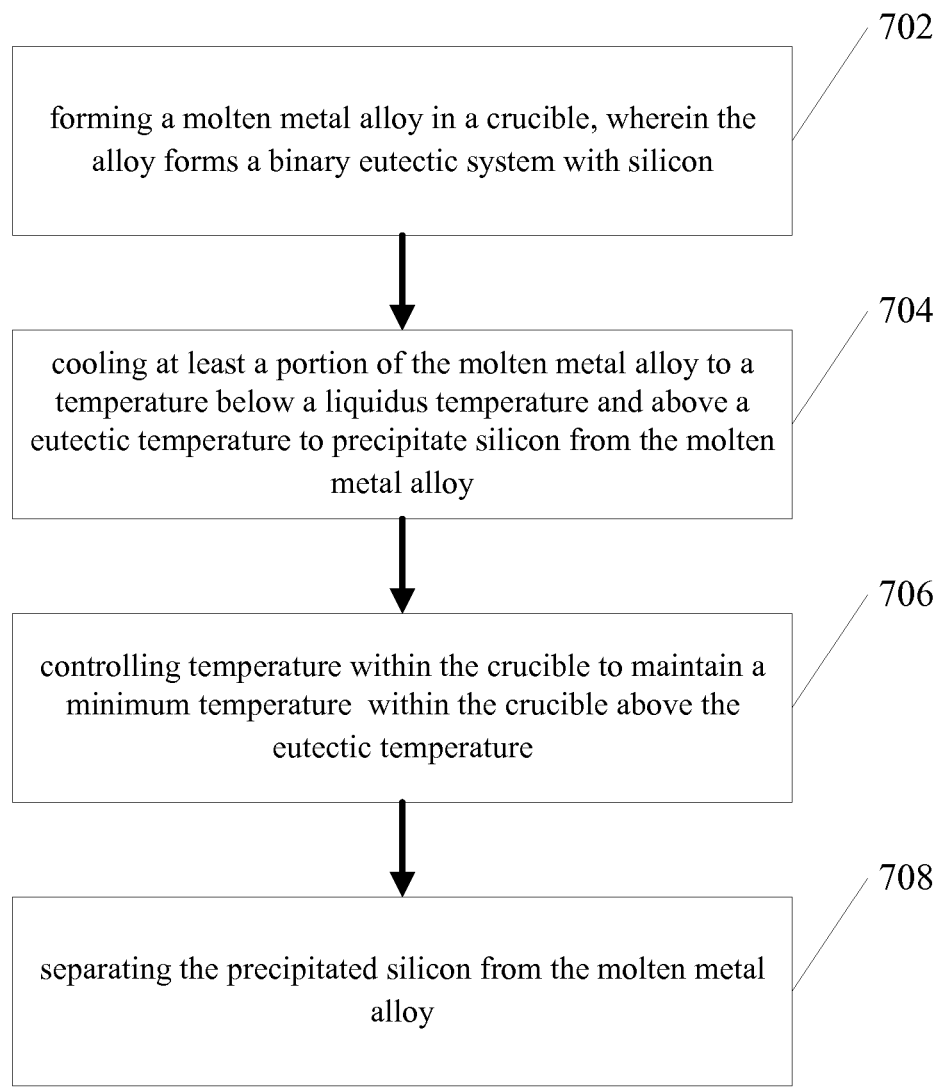
FIG. 7 shows a flow diagram of an example method according to at least one embodiment of the invention.

FIG. 7 illustrates a flow diagram of a method as described from selected examples above. In operation 702, a molten metal alloy is formed in a crucible to form a binary eutectic alloy with silicon. As discussed above, one alloy includes an aluminum-silicon alloy. In operation 704, at least a portion of the molten metal alloy is cooled to a temperature below a liquidus temperature and above a eutectic temperature to precipitate silicon from the molten metal alloy. In operation 706, temperature is controlled within the crucible to maintain a minimum temperature above the eutectic temperature within the crucible, and in operation 708, the precipitated silicon is separated from the molten metal alloy.

While a number of embodiments of the present subject matter have been described, the above embodiments are not intended to be exhaustive. It will be appreciated by those of ordinary skill in the art that any arrangement configured to achieve silicon purification using directional solidification techniques, while maintaining consistent progression of a solid-liquid interface throughout a mold can be substituted for the specific embodiment shown. Combinations of the above embodiments, and other embodiments, will be apparent to those of skill in the art upon studying the above description. This application is intended to cover any adaptations or variations of the present subject matter. It is to be understood that the above description is intended to be illustrative and not restrictive.

What is claimed is:

1. A method, comprising:
    forming a molten metal alloy in a crucible, wherein the alloy forms a binary eutectic system with silicon;
    cooling at least a portion of the molten metal alloy to a temperature below a liquidus temperature and above a eutectic temperature to precipitate silicon from the molten metal alloy;
    controlling temperature within the crucible to maintain a minimum temperature above the eutectic temperature within the crucible;
    actively heating at least a top surface of the crucible to maintain a minimum temperature above the eutectic temperature within the crucible;
    preferentially cooling the crucible from a bottom surface that includes a heat conducting material having a higher thermal conductivity than walls of the crucible; and
    separating the precipitated silicon from the molten metal alloy.

2. The method of claim 1, wherein forming a molten metal alloy in a crucible includes forming a silicon-aluminum alloy in a crucible.

3. The method of claim 2, wherein forming a molten metal alloy in a crucible includes forming silicon-aluminum alloy in a starting composition between approximately 60 wt. % silicon and 22 wt. % silicon, with a balance being substantially aluminum.

4. The method of claim 2, wherein forming a molten metal alloy in a crucible includes forming silicon-aluminum alloy in a starting composition between approximately 50 wt. % silicon and 30 wt. % silicon, with a balance being substantially aluminum.

5. The method of claim 2, wherein cooling includes maintaining a temperature within the crucible in a range between approximately 577° C.-1100° C.

6. The method of claim 2, wherein cooling includes maintaining a temperature within the crucible in a range between approximately 720° C.-1100° C.

7. The method of claim 2, wherein cooling includes maintaining a temperature within the crucible in a range between approximately 650° C.-960° C.

8. The method of claim 1, wherein controlling temperature within the crucible includes covering a top of the crucible.

9. A method, comprising:
forming a molten metal alloy in a crucible, wherein the alloy forms a binary eutectic system with silicon;
cooling the molten metal alloy to a temperature below a liquidus temperature and above a eutectic temperature to precipitate silicon from the molten metal alloy;
actively heating the crucible to maintain a minimum temperature above the eutectic temperature within the crucible, wherein actively heating the crucible includes heating a top surface of the crucible;
preferentially cooling the crucible from a bottom surface that includes a heat conducting material having a higher thermal conductivity than walls of the crucible; and
separating the precipitated silicon from the molten metal alloy.

10. The method of claim 9, wherein forming a molten metal alloy in a crucible includes forming a silicon-aluminum alloy in a crucible.

11. The method of claim 9, wherein actively heating the crucible includes heating sides of the crucible.

* * * * *